United States Patent [19]

Krivanek

[11] Patent Number: 5,300,776
[45] Date of Patent: Apr. 5, 1994

[54] AUTOADJUSTING ELECTRON MICROSCOPE

[75] Inventor: Ondrej L. Krivanek, Oakland, Calif.

[73] Assignee: Gatan, Inc., Pleasanton, Calif.

[21] Appl. No.: 945,603

[22] Filed: Sep. 16, 1992

[51] Int. Cl.⁵ .......................................... H01J 37/295
[52] U.S. Cl. ..................................... 250/307; 250/311
[58] Field of Search ..................... 250/307, 311, 396 R

[56]     References Cited
U.S. PATENT DOCUMENTS

| 4,379,230 | 4/1983 | Bouwhuis et al. | 250/311 |
| 4,618,766 | 10/1986 | von der Mast et al. | 250/311 |
| 4,680,469 | 7/1987 | Nomura et al. | 250/311 |
| 4,695,725 | 9/1987 | Mori et al. | 250/311 |
| 4,820,921 | 4/1989 | Bakker et al. | 250/307 |
| 5,084,618 | 1/1992 | Ito | 250/311 |
| 5,144,129 | 9/1992 | Kobayashi et al. | 250/311 |

OTHER PUBLICATIONS

W. O. Saxton, D. J. Smith and S. J. Erasmus, "Procedures for focussing, stigmating, and alignment in high resolution electron microscopy", Journal of Microscopy, vol. 130, pp. 187–201 (1983).
S. J. Erasmus and K. C. A. Smith, "An Automatic Focussing and Astigmatism Correction System for the SEM and CTEM", Journal of Microscopy, vol. 127, pp. 185–199 (1982).

Primary Examiner—Bruce C. Anderson
Attorney, Agent, or Firm—Killworth, Gottman, Hagan & Schaeff

[57]       ABSTRACT

A method and an apparatus comprising a transmission electron microscope, an electron camera, a computer, and microscope control electronics. The electron camera captures an image produced by the electron microscope, the computer transforms the image into a digital diffractogram, and determines the microscope defocus and astigmatism by analyzing the diffractogram. The computer uses the determined astigmatism and defocus values to stigmate the microscope, and to set the defocus to a user-selected value. The computer also changes the direction of electron illumination to different values, and works out the true location of the optic axis of the microscope from the changes in the diffractograms recorded for the different illumination directions.

10 Claims, 1 Drawing Sheet

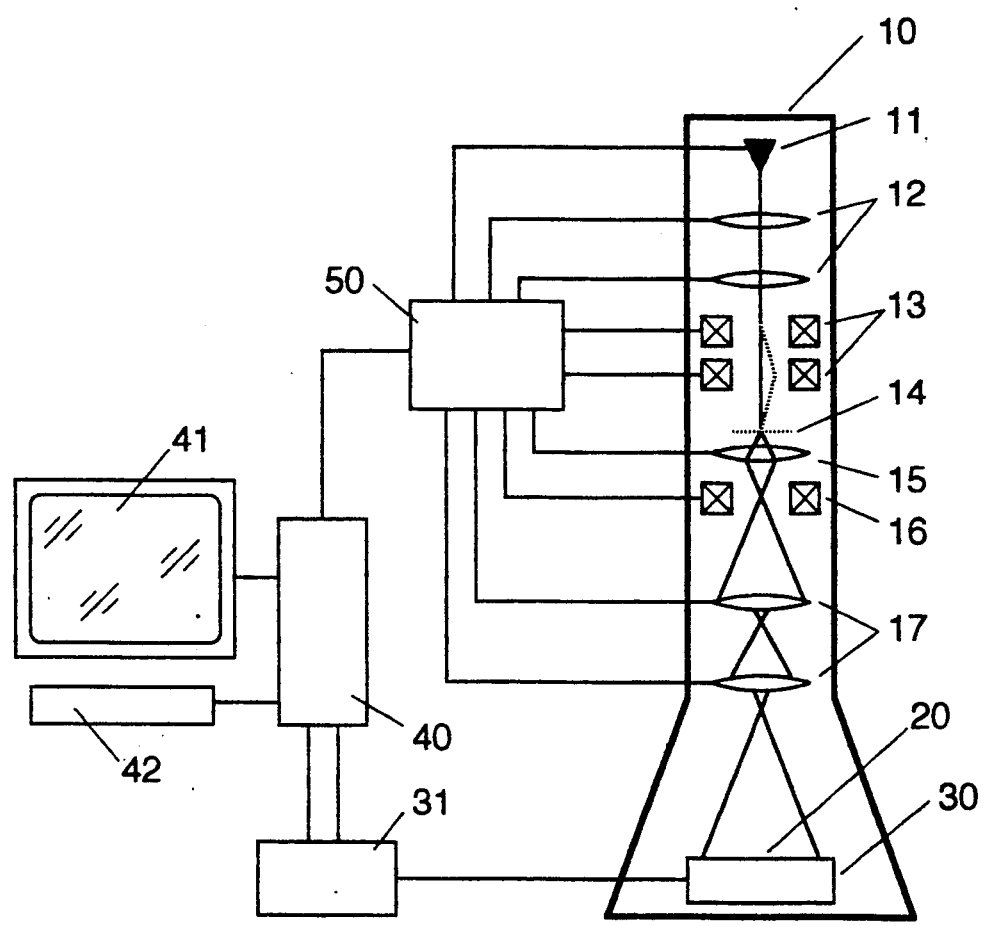

AUTOADJUSTING ELECTRON MICROSCOPE

BACKGROUND OF THE INVENTION

1. Field of the Invention

This invention relates to transmission electron microscopes, and particularly to the auto-adjustment of high resolution transmission electron microscopes.

2. Description of Prior Art

Modem transmission electron microscopes (TEMS) are able to resolve individual atoms and columns of atoms in thin samples of inorganic and organic materials. However, the images produced by such microscopes can only be correctly interpreted in terms of the atomic structure of the sample if the imaging parameters of the microscope are controlled with a very high degree of accuracy. In particular, the focus of the objective lens of the TEM must be set with a precision better than about 2 nm, the astigmatism of the objective lens must be set with a precision better than about 1 nm, and the direction of the electron beam incident on the sample must be adjusted to be parallel to the optic axis of the microscope objective lens with a precision better than about $10^{-4}$ radians.

Making the needed adjustments is a task requiring a high level of theoretical knowledge and experimental skill, which restricts the availability of the atom-resolving ability of modern TEMs to a handful of experts. If the needed adjustments could be performed automatically, the power of modem TEMs would become available to a much wider range of scientific researchers.

A method for auto-adjusting a TEM is known from an article by W. O. Saxton, D. J. Smith and S. J. Erasmus published in the Journal of Microscopy, vol. 130 (1983), pp. 187–201 and by S. J. Erasmus and K. C. A. Smith published in the Journal of Microscopy, vol. 127 (1982) pp. 185–199. The method described therein monitors the contrast of the image of a thin film of an amorphous material while the defocus, astigmatism (in x and y directions) and the beam tilt (in x and y directions) are being varied. It utilizes the fact that there is a global minimum in the contrast of a thin amorphous material imaged by a high resolution TEM when the five parameters are varied, and that this minimum corresponds to a well defined condition of a correctly stigmated and aligned microscope set to the Gaussian (minimum phase contrast) defocus. The method has been demonstrated to be able to autoadjust an electron microscope with the required precision. However, in order to find the global minimum, it needs to acquire and analyze about 20 images while each of the 5 parameters is varied. Thus the method needs a total of about 100 images per one pass. This makes it very slow, and hence unsuitable for the daily operation of a TEM. The method also typically results in an unacceptably high irradiation dose delivered to the sample while the microscope is being adjusted. Moreover, the analysis of 100 images requires a large amount of computational power, making special image-processing hardware such as an array processor essential for the method.

A different method for autoadjusting a TEM was disclosed in U.S. Pat. No. 4,618,766 by K. D. van der Mast and U. Gross. The method described therein varies the angle of the electron illumination incident on the sample, determines the image shift accompanying the change in the illumination angle, and uses the image shift value to find the optimum setting of the microscope. This method needs only about 10 images to autoadjust a TEM, and works well at low magnifications. At high magnifications, however, the precision of the method is limited by the fact that the image detail changes when the illumination direction is changed, making it impossible to determine the image shift with the required accuracy. This makes the method unsuitable when high magnifications are needed, for instance when the atomic structure of the sample needs to be resolved. Further, the computational requirements for determining the image shifts are quite considerable, thus also necessitating the use of special image-processing hardware.

Most users of TEMs would find significant advantage in a method and an apparatus for autoadjusting a high resolution transmission electron microscope operating at medium and high magnification, which achieved the required precision using either a single or very few recorded images, and which performed the required adjustments in only a few seconds. Moreover, the users would find significant advantage in an autoadjustment method whose computational demands could be satisfied by a high-end personal computer not equipped with any additional image-processing hardware.

OBJECTS AND ADVANTAGES

Accordingly, several of the objects and advantages of the present invention are: to provide an autoadjustment method and apparatus for a high resolution transmission electron microscope which can adjust the microscope using either a single image or very few images, which can consistently achieve and exceed the required precision of the adjustments, and whose computational demands are small enough so that a high-end personal computer can fulfill them without any additional image-processing hardware.

Readers will find further objects and advantages of the invention from a consideration of the ensuing description and the accompanying sole FIGURE.

DRAWING REFERENCE NUMERALS

10: electron microscope
11: electron gun
12: condenser lenses
13: illumination deflectors
14: transmission sample
15: objective lens
16: stigmator
17: projector lenses
20: final image
30: electron camera
31: camera electronics
40: computer
41: computer display
42: input device
50: microscope electronics

DESCRIPTION

The invention is based on the fact that a single diffractogram computed from a high resolution image of a thin amorphous material contains sufficient information to characterize the defocus and the astigmatism of an electron microscope. The invention extracts the information from the diffractogram by an automatic analysis routine, and then uses the information to autoadjust the focus and astigmatism of the objective lens of the microscope. The invention also performs the automated analysis on a series of diffractograms recorded for different tilts of the electron beam incident on the sample, and works out the location of the coma-free axis of the electron microscope by analyzing the changes in apparent focus and astigmatism that result from the beam tilt.

A schematic view of an auto-adjusting high resolution transmission electron microscope apparatus of the invention is shown in the sole FIGURE.

A transmission electron microscope 10 comprises an electron gun 11, condenser lenses 12 and an illumination deflector system 13, which together focus a beam of electrons onto a thin sample 14. Electrons transmitted through the sample form an image which is magnified by an objective lens 15 and stigmated by stigmators 16, further magnified by projector lenses 17, and projected as a final image 20 onto an electron camera 30. The camera transforms the electron image into a series of electronic signals which are sent to camera electronics 31, where they are processed and transmitted to a computer 40. The computer is equipped with a monitor 41 for displaying images and other data, and an input device 42 such as a keyboard, mouse, or a trackball for accepting user input. The computer has a communication link to microscope electronics 50, and is able to control various microscope elements, including but not necessarily limited to the illumination deflection system 13, the objective lens 15, and the stigmators 16.

The sample 14 is a thin amorphous material such as an amorphous carbon or germanium, or an amorphous contamination layer on a crystalline sample. The camera 30 records the final image 20 of the sample at an electron-optical magnification of typically 100,000 to 1,000,000 times. The preferred camera is a slow scan CCD camera that converts the electron image into a light image in a thin scintillator, transmits the light image to a scientific-grade slow-scan CCD chip, reads and digitizes the image with a high sensitivity and dynamic range, and transmits the image to the computer 40 over a digital interface. However, other cameras giving immediate electronic readout can also be used, such as TV-rate cameras adapted for the detection of electron images, 1-dimension detectors that detect images by scanning them over the detector in a transverse direction, and even single-channel detectors that detect images by scanning them over the detector in two different directions.

The computer 40 computes a digital diffractogram of the final image or of a sub-area of the image. A digital diffractogram is typically computed using a Fourier transform algorithm, and then computing the intensity of the transform, but it can also be worked out using related transforms such as the Walsch transform. The typical diffractogram contains a series of bright and dark stripes resembling concentric ellipses or hyperbolas. The bright areas correspond to spatial frequencies of the amorphous sample that were transferred with maximum efficiency into the final image, and the dark areas correspond to spatial frequencies that were not transferred or transferred very poorly. A section through the origin of the diffractogram in a particular azimuthal direction produces a profile of alternating minima and maxima whose positions are characteristic of the defocus of the microscope in that particular direction. In the presence of astigmatism, sections in different directions produce profiles with the minima and maxima in different positions.

The computed diffractogram is sectioned by the computer 40 in different directions with a typical angular increment of around 10°. Since diffractograms are centrosymmetric, only one half of all possible directions needs to be analyzed, yielding typically 18 different experimental profiles from one diffractogram. The defocus value best corresponding to each profile is then derived by comparing each experimental profile with an array of simulated profiles computed for the appropriate microscope parameters by using expressions of standard phase contrast TEM imaging theory, given for instance in an article by O. L. Krivanek published in Optik, vol. 45 (1976), pp. 97–101.

The preferred comparison method works out an array of cross-correlation coefficients computed as $C_{ij}=\Sigma_n(P_{i,n}S_{j,n})$, where $P_{i,n}$ denotes the n-th pixel of the experimental diffractogram profile worked out for the i-th direction, $S_{j,n}$ denotes the n-th pixel of the diffractogram profile simulated for the j-th defocus, and $\Sigma_n$ denotes a summation over all values of n. The cross-correlation coefficients worked out for each experimental profile have a maximum at a particular value of j denoted as jm, and the defocus best corresponding to that profile is the $j_m$-th defocus value. The experimentally determined variation of defocus as a function of angle is then fitted to the dependence expected when defocus and astigmatism are the principal factors affecting the shape of the diffractogram. This is done using an expression of the form $\Delta Z_i = \Delta Z + A \cos(2(\theta_i - \theta_o))$, where $\Delta Z_i$ is the fitted defocus value for the i-th segment, $\Delta Z$ is the overall defocus value determined for the recorded image, A is the coefficient of astigmatism determined for the image, $\theta_i$ is the azimuthal angle of the i-th profile, and $\theta_o$ is the angle of maximum overfocus determined for the image.

The analysis described in the preceding paragraph results in an automatic determination of the defocus and the astigmatism value for the experimental image. The determined astigmatism is a vector with two components given by $A_x = A \cos(\theta_o)$, and $A_y = A \sin(\theta_o)$. Having worked out the defocus and the astigmatism, the computer then proceeds to set the astigmatism to zero, and the defocus to a user-selected value. This part of the operation is made possible by a link between the computer and the microscope electronics, which permits the computer to set the defocus and the astigmatism under software control. The preferred link between the computer and the microscope electronics is a digital one, but it is also possible to control the required electron-optical elements of the microscope by producing controlling voltages in digital-to-analog (D/A) converters driven by the computer, and sending appropriate voltages to analog summing junctions in the microscope electronics. The computer control of the microscope is readily calibrated by the computer changing the currents supplied to the objective lens and the stigmator coils by a small amount, and working out the effect of the change by performing the automated diffractogram analysis on images recorded before and after the change.

The direction of the illuminating beam relative to the optic axis of the objective lens of the microscope is worked out by tilting the illumination under computer control by different amounts, recording an image at each tilt, determining the defocus and astigmatism values for each image, and analyzing the variation in these values that results from the tilt. The preferred method is to tilt the beam to +t, 0, and −t tilt values, and to determine the magnitude and the direction of the misalignment of the illuminating electron beam with respect to the true optic axis of the microscope using the following formula:

$$m = \frac{A_1 - A_2}{2[A_1 + A_2 - 2A_0]} t$$

where m is the misalignment of the illumination, and $A_0$, $A_1$, and $A_2$ are the apparent astigmatism values determined for the 0, t, and −t tilt values, respectively. The formula uses a compact notation system in which italics denote complex numbers, astigmatism values are written as $A = A_x + i A_y$, and the tilt vectors are similarly written as $t = t_x + i t_y$ and $m = m_x + i m_y$. The computer then automatically applies the tilt −m to the illumination, resulting in coma-free alignment using only 3 captured images.

Practical experience with the method and apparatus of the invention shows that performing the analysis using digital diffractograms of 256×256 pixels easily leads to the required precision, and that when the computer 40 is a high-end personal computer such as a Macintosh Quadra, the complete set of operations required to focus and stigmate the microscope, including capturing an image with a slow scan CCD camera, can be performed in less than 10 seconds. This is much less than is possible with any other presently known TEM autoadjusting method including the method of van der Mast and Gross, which requires 4–8 images and typically more than a minute of computations on a high-end personal computer to focus and stigmate the microscope. The alignment of the microscope requires three images to be recorded and analyzed under the present method, and is typically performed in less than 30 seconds. This is again considerably faster than any other presently known TEM autoadjustment method including the method of van der Mast and Gross, which requires more than 10 images and considerably longer time to find the coma-free axis.

While the above description contains many specificities, the reader should not construe these as limitations on the scope of the invention, but merely as exemplifications of the preferred embodiment thereof Those skilled in the art will envisage other possible variations within its scope. For example, the method of the invention is equally applicable to any scanning transmission electron microscope in which a narrow beam is mastered across the sample, and the final image is detected as a temporal variation of the intensity detected by an electron detector situated down-stream from the sample.

In another example, the computer 40 used to receive and analyze the images can be replaced by a distributed computing system in which a first part receives images from the electron camera 30, a second part such as an array processor or other dedicated image-processing hardware performs a fast computation of digital diffractograms, and either the first or the second part, or yet another part works out the needed adjustments and communicates them to the microscope electronics.

In another example, the automatic determination of the variation of the defocus and astigmatism as a function of the incident beam tilt can be used to automatically analyze and correct microscope aberrations caused by effects other than astigmatism, defocus, or illumination misalignment. Examples of the additional aberrations include, but are not limited to, spherical aberration of the fifth and higher orders, 3-fold and higher-order astigmatism, and a variety of aberrations arising when the cylindrical symmetry of the microscope system is lost, for instance when a quadrupole-octupole or a double-sextupole aberration correction system is employed. The analysis of these aberrations requires that the beam direction be varied in a more complicated manner than the simple +t, 0, −t variation employed to determine the tilt of the illumination with respect to the coma-free axis, but the principle whereby the imaging properties of the microscope are determined from the tilt-dependent variation of the apparent defocus or astigmatism worked out by an automatic analysis a digital diffractogram remains the same.

In yet another example, the method can also be applied to thin crystalline samples covered by a thin contamination layer that is typical in electron microscopy. This is done by using an extra step in the method, in which each newly computed experimental diffractogram is analyzed for the presence of intense peaks due to Bragg reflections from the lattice planes of a crystal, and these peaks are eliminated using a threshold set at a suitable level. This effectively subtracts the crystalline contribution to the diffractogram, leaving only the contribution from the thin amorphous layer, which enables the autoadjustment to proceed as if only the amorphous material contributed to the image.

What is claimed is:

1. A method for autoadjusting defocus or astigmatism of a transmission electron microscope, said method comprising the steps of:
   i) illuminating a thin sample of an amorphous material with a beam of electrons in a transmission electron microscope,
   ii) producing a transmission electron image of said sample,
   iii) recording said image with an electron camera,
   iv) transferring said image captured by said camera to a digital computer,
   v) computing a digital diffractogram of said image,
   vi) automatically analyzing said diffractogram to determine values of defocus and astigmatism best corresponding to it,
   vii) working out needed corrections to defocus or astigmatism circuits of said microscope from said determined values of defocus and astigmatism, using previously determined calibrations of strengths of said circuits, and
   viii) applying said corrections to the microscope via a communication link between said computer and said microscope,
   whereby said defocus or said astigmatism of said microscope is adjusted automatically from a single recorded image.

2. The method of claim 1 wherein said astigmatism and defocus values are determined by computing a plurality of radial profiles through said digital diffractogram taken in different azimuthal directions, and cross-correlating said profiles with an array of simulated diffractograms computed for a range of defocus values, such that the defocus best corresponding to each profile is determined as that defocus value which gives the highest cross-correlation coefficient.

3. The method of claim 1 wherein further electron micrographs are acquired and analyzed in order to improve the precision of the resultant automatic astigmatism and defocus adjustment.

4. The method of claim 1 wherein said sample comprises both amorphous and crystalline areas, and the contribution of said crystalline areas to said digital diffractogram is eliminated by a thresholding algorithm.

5. The method of claim 1 wherein said electron image is recorded by a slow-scan CCD camera.

6. The method of claim 1 wherein said electron image is recorded by a TV-rate camera provided with digitizing and transferring electronics for capturing and transferring said images to said digital computer.

7. The method of claim 1 wherein said digital computer is a high-end personal computer used without any additional image-processing hardware.

8. A method for autoaligning the direction of electron beam incident on a thin sample in a transmission electron microscope, said method comprising the steps of:
  i) illuminating a thin sample with a beam of electrons in a transmission electron microscope from a plurality of directions,
  ii) producing a transmission electron image of said sample for each said direction of said electron beam,
  iii) capturing each said image with an electron camera,
  iv) transferring each said image captured by said camera to a digital computer,
  v) computing a digital diffractogram of each said image,
  vi) automatically analyzing each said diffractogram to determine values of apparent defocus and astigmatism best corresponding to said diffractogram,
  vii) determining the direction of the optic axis of said electron microscope from the variation of said apparent astigmatism or said apparent defocus with said illumination direction,
  vii) changing said direction of said electron beam so that said electron beam illuminating said sample travels parallel to the optic axis of said microscope,
  whereby said microscope is aligned automatically by said computer using as few as three electron micrographs.

9. The method of claim 8 wherein said plurality of directions of said electron beam comprises illuminating said sample from directions m, m+t, and m−t, where m is the unknown initial misalignment of said beam and t is an additional applied tilt, and determining said misalignment m according to the formula:

$$m = \frac{A_1 - A_2}{2[A_1 + A_2 - 2A_0]} t$$

where $A_0$, $A_1$, and $A_2$ are, respectively, apparent astigmatism values determined for the images obtained with the m, m+t, and m−t incident beam directions, and expressed in a notation system employing complex numbers.

10. The method of claim 8 wherein said plurality of directions of said electron beam comprises additional directions, and said determined values of automatically determined astigmatism or defocus are used to characterize additional microscope properties comprising but not limited to 3-fold astigmatism of said objective lens.

* * * * *